(12) United States Patent
Zhang et al.

(10) Patent No.: US 11,011,411 B2
(45) Date of Patent: May 18, 2021

(54) SEMICONDUCTOR WAFER HAVING INTEGRATED CIRCUITS WITH BOTTOM LOCAL INTERCONNECTS

(71) Applicant: International Business Machines Corporation, Armonk, NY (US)

(72) Inventors: Chen Zhang, Guilderland, NY (US);
Xin Miao, Guilderland, NY (US);
Wenyu Xu, Albany, NY (US);
Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 31 days.

(21) Appl. No.: 16/361,995

(22) Filed: Mar. 22, 2019

(65) Prior Publication Data

US 2020/0303244 A1 Sep. 24, 2020

(51) Int. Cl.
*H01L 21/762* (2006.01)
*H01L 27/12* (2006.01)
*H01L 21/8238* (2006.01)
*H01L 21/768* (2006.01)
*H01L 21/84* (2006.01)
*H01L 29/66* (2006.01)
*H01L 29/78* (2006.01)

(52) U.S. Cl.
CPC .. *H01L 21/76264* (2013.01); *H01L 21/76243* (2013.01); *H01L 21/76895* (2013.01); *H01L 21/823814* (2013.01); *H01L 21/823871* (2013.01); *H01L 21/823878* (2013.01); *H01L 21/823885* (2013.01); *H01L 21/84* (2013.01); *H01L 27/1207* (2013.01); *H01L 29/66545* (2013.01); *H01L 29/7827* (2013.01)

(58) Field of Classification Search
CPC ................. H01L 21/823814; H01L 21/823871
See application file for complete search history.

(56) References Cited

U.S. PATENT DOCUMENTS

| | | | |
|---|---|---|---|
| 4,505,799 A | * | 3/1985 | Baxter ................. G01N 27/414 |
| | | | 204/416 |
| 5,082,796 A | | 1/1992 | El-Diwany et al. |
| 5,260,233 A | | 11/1993 | Butt et al. |
| 5,332,913 A | | 7/1994 | Shappir |

(Continued)

*Primary Examiner* — Victoria K. Hall
(74) *Attorney, Agent, or Firm* — Cantor Colburn LLP; Douglas Pearson

(57) ABSTRACT

A semiconductor wafer includes a substrate. The substrate includes a first substrate region doped with a first dopant and a second substrate region doped with a second dopant. The semiconductor wafer further includes a buried oxide (BOX) layer formed on the substrate and a channel layer formed above the BOX layer. A first transistor is operably disposed on the substrate in the first substrate region and a second transistor is operably disposed on the substrate in the second substrate region. First doped source and drain structures electrically connected to the substrate in the first substrate region and separated by portions of the channel layer and the BOX layer. Second doped source and drain structures electrically connected to the substrate in the second substrate region and separated by portions of the channel layer and the BOX layer.

14 Claims, 16 Drawing Sheets

(56) References Cited

U.S. PATENT DOCUMENTS

| | | | |
|---|---|---|---|
| 6,355,950 B1* | 3/2002 | Livengood | H01L 23/5286 257/276 |
| 6,555,891 B1* | 4/2003 | Furukawa | H01L 21/76262 257/347 |
| 6,870,225 B2* | 3/2005 | Bryant | H01L 21/84 257/347 |
| 6,930,030 B2* | 8/2005 | Rausch | H01L 21/3065 438/589 |
| 7,153,756 B1 | 12/2006 | Houston | |
| 7,525,121 B2* | 4/2009 | Hsu | H01L 21/76283 257/350 |
| 8,587,063 B2* | 11/2013 | Dennard | H01L 21/02002 257/347 |
| 8,685,847 B2* | 4/2014 | Majumdar | H01L 29/66545 257/347 |
| 8,716,091 B2* | 5/2014 | Cohen | H01L 21/82341 257/E21.431 |
| 9,093,316 B2* | 7/2015 | Kuroda | H01L 23/481 |
| 9,159,825 B2* | 10/2015 | Molin | H01L 29/66272 |
| 9,431,305 B1* | 8/2016 | Anderson | H01L 29/7827 |
| 9,704,880 B2 | 7/2017 | Lin et al. | |
| 9,953,857 B2 | 4/2018 | Leobandung et al. | |
| 10,269,905 B2* | 4/2019 | Radens | H01L 21/30604 |
| 10,699,963 B2* | 6/2020 | Tsai | H01L 21/76224 |
| 10,763,170 B2* | 9/2020 | Verma | H01L 23/5283 |
| 2005/0116290 A1* | 6/2005 | de Souza | H01L 27/1203 257/347 |
| 2006/0170045 A1* | 8/2006 | Yan | H01L 21/76232 257/347 |
| 2007/0069300 A1 | 3/2007 | Cheng et al. | |
| 2008/0169490 A1* | 7/2008 | Kawai | H01L 29/66628 257/288 |
| 2008/0206977 A1* | 8/2008 | Frank | H01L 21/76898 438/597 |
| 2009/0020841 A1* | 1/2009 | Hu | H01L 31/105 257/442 |
| 2010/0019385 A1* | 1/2010 | Bartley | H01L 27/1203 257/741 |
| 2011/0006371 A1* | 1/2011 | Luo | H01L 27/1203 257/369 |
| 2011/0140232 A1* | 6/2011 | Gaul | H01L 21/76283 257/508 |
| 2011/0241073 A1* | 10/2011 | Cohen | H01L 29/7848 257/192 |
| 2012/0112290 A1* | 5/2012 | Utomo | H01L 29/165 257/369 |
| 2012/0231620 A1* | 9/2012 | Kuroda | H01L 21/76895 438/586 |
| 2014/0367753 A1* | 12/2014 | Huang | H01L 23/481 257/288 |
| 2015/0035060 A1* | 2/2015 | Cheng | H01L 27/092 257/351 |
| 2015/0084130 A1* | 3/2015 | Yin | H01L 21/84 257/348 |
| 2015/0145048 A1* | 5/2015 | Cheng | H01L 27/0924 257/351 |
| 2015/0270285 A1* | 9/2015 | Cheng | H01L 21/84 257/351 |
| 2016/0020138 A1* | 1/2016 | Chang | H01L 21/743 257/347 |
| 2017/0179243 A1* | 6/2017 | Radens | H01L 23/53257 |
| 2017/0186693 A1* | 6/2017 | Stamper | H01L 23/53238 |
| 2018/0061766 A1* | 3/2018 | Goktepeli | H01L 21/76256 |
| 2018/0082997 A1* | 3/2018 | Li | H01L 27/0922 |
| 2018/0158736 A1* | 6/2018 | Fenouillet-Beranger | H01L 21/823814 |
| 2019/0214387 A1* | 7/2019 | Holt | H01L 21/82380 |
| 2019/0221649 A1* | 7/2019 | Glass | H01L 21/823418 |
| 2020/0098754 A1* | 3/2020 | Pillarisetty | H01L 21/82384 |

* cited by examiner (View along line A - A')

SEMICONDUCTOR WAFER HAVING INTEGRATED CIRCUITS WITH BOTTOM LOCAL INTERCONNECTS

BACKGROUND

The present invention generally relates to fabrication methods and resulting structures for semiconductor wafers. More specifically, the present invention relates to fabrication methods and resulting structures for forming semiconductor wafers with a bottom local interconnect structure.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., S/D contacts) and other structures that communicatively couple to active regions (e.g., gate, source, and drain) of the device element. Layers of interconnections (also known as metallization layers) are formed above these logical and functional layers during the BEOL stage to complete the IC.

SUMMARY

According to a non-limiting embodiment of the present invention, a semiconductor wafer is provided that includes a substrate. The substrate includes a first substrate region doped with a first dopant and a second substrate region doped with a second dopant. The semiconductor wafer further includes a buried oxide (BOX) layer formed on the substrate and a channel layer formed above the BOX layer. A first transistor is operably disposed on the substrate in the first substrate region and a second transistor is operably disposed on the substrate in the second substrate region. First doped source and drain structures electrically connected to the substrate in the first substrate region and separated by portions of the channel layer and the BOX layer. Second doped source and drain structures electrically connected to the substrate in the second substrate region and separated by portions of the channel layer and the BOX layer.

Embodiments of the present invention are further directed to a method for fabricating a semiconductor wafer. A non-limiting example of the method includes providing a substrate that includes a first substrate region doped with a first dopant and a second substrate region doped with a second dopant. The method further includes forming a buried oxide (BOX) layer on the substrate and forming a channel layer above the BOX layer. In addition, the method includes forming a first transistor on the substrate in the first substrate region and forming a second transistor on the substrate in the second substrate region. Even further, the method provides forming first doped source and drain structures being electrically connected to the substrate in the first substrate region and separated by portions of the channel layer and the BOX layer and forming second doped source and drain structures being electrically connected to the substrate in the second substrate region and separated by portions of the channel layer and the BOX layer.

According to yet another non-limiting embodiment, a method of fabricating a semiconductor wafer includes providing a silicon-on-insulator (SOI) substrate that includes a first substrate region doped with a first dopant and a second substrate region doped with a second dopant. The method further includes forming a first transistor on the substrate in the first substrate region and forming a second transistor on the substrate in the second substrate region. In addition, the method provides for forming first doped source and drain structures being electrically connected to the substrate in the first substrate region and separated by portions of a channel layer and a buried oxide (BOX) layer and forming second doped source and drain structures being electrically connected to the substrate in the second substrate region and separated by portions of the channel layer and the BOX layer. Even further, the method includes inverting the substrate, bonding the substrate to a host substrate, and removing the substrate thereby exposing the first doped source and drain structures, the second doped source and drain structures and the buried oxide (BOX) layer.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-6 depict cross-sectional views of a semiconductor wafer after fabrication operations for forming an IC having a bottom interconnect structure according to embodiments of the invention, in which:

FIG. 1 depicts a cross-sectional view illustrating a structure that results from performing initial fabrication operations in accordance with embodiments of this invention;

FIG. 2 depicts a cross-sectional view illustrating fabrication operations in accordance with embodiments of the invention;

FIG. 3 depicts a cross-sectional view of FIG. 2, illustrating fabrication operations in accordance with embodiments of the invention;

FIG. 4 depicts a cross-sectional view illustrating fabrication operations in accordance with embodiments of the invention;

FIG. 5 depicts a cross-sectional view illustrating fabrication operations in accordance with embodiments of the invention; and FIG. 6 depicts a cross-sectional view illustrating fabrication operations in accordance with embodiments of the invention.

FIGS. 7-14 depict cross-sectional views of a semiconductor wafer after fabrication operations for forming an IC where both a power supply voltage (VDD) and ground (GND) contacts can be formed on a backside of a wafer according to an alternative embodiment of the present disclosure, in which:

FIG. 7 depicts a cross-sectional view illustrating fabrication operations in accordance with embodiments of the invention;

FIG. 8 depicts a cross-sectional view of FIG. 7 illustrating fabrication operations in accordance with embodiments of the invention;

FIG. 9 depicts a cross-sectional view illustrating fabrication operations in accordance with embodiments of the invention;

FIG. 10 depicts a cross-sectional view of FIG. 9 illustrating fabrication operations in accordance with embodiments of the invention;

FIG. 11 depict a cross-sectional view illustrating fabrication operations in accordance with embodiments of the invention;

FIG. 12 depicts a cross-sectional view illustrating fabrication operations in accordance with embodiments of the invention;

FIG. 13 depicts a cross-sectional view illustrating fabrication operations in accordance with embodiments of the invention; and FIG. 14 depicts a cross-sectional view of FIG. 13 illustrating fabrication operations in accordance with embodiments of the invention.

FIGS. 15-20 depict cross-sectional views of a semiconductor wafer after fabrication operations for forming an IC where a wafer includes two buried oxide layers according to an alternative embodiment of the present disclosure, in which:

FIG. 15 depicts a cross-sectional view illustrating a structure with two buried oxide layers that results from performing initial fabrication operations in accordance with embodiments of the invention;

FIG. 16. depicts a cross-sectional view illustrating fabrication operations in accordance with embodiments of the invention depicted in FIG. 15.

FIG. 17 depicts a cross-sectional view of FIG. 16 illustrating fabrication operations in accordance with embodiments of the invention;

FIG. 18 depicts a cross-sectional view illustrating fabrication operations in accordance with embodiments of the invention;

FIG. 19 depicts a cross-sectional view of FIG. 18 illustrating fabrication operations in accordance with embodiments of the invention; and FIG. 20 depicts a cross-sectional view illustrating fabrication operations in accordance with embodiments of the invention depicted.

Figure 1:
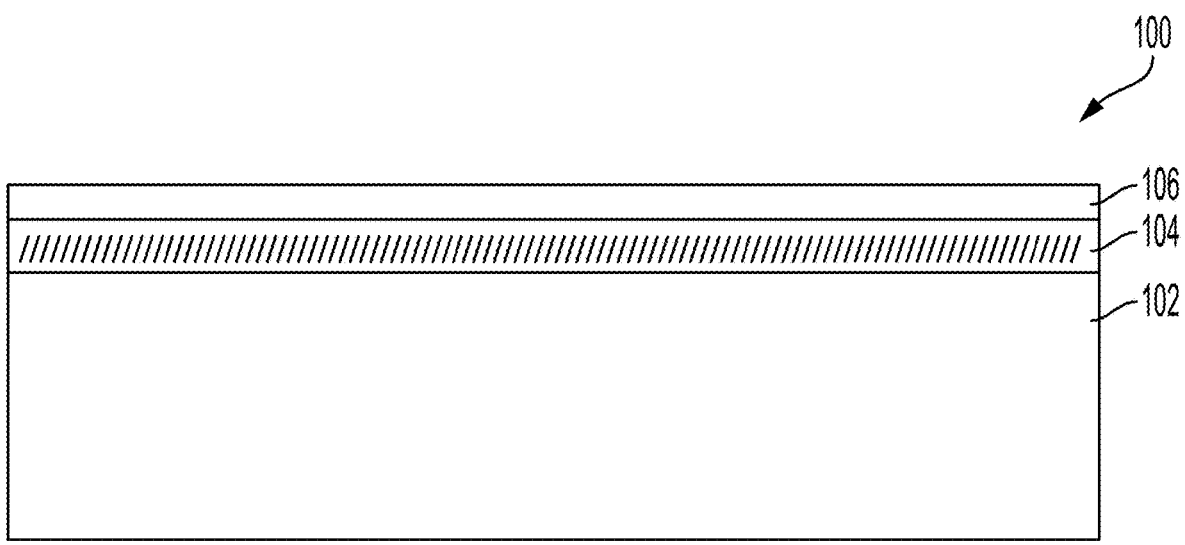

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, in present semiconductor technology, the fabrication of the semiconductor devices includes forming various electronic components on and within semiconductor substrates. For example, semiconductor devices can include transistors, resistors, capacitors, and the like. Local interconnect wiring structures are used to electrically connect different transistors fabricated on a common semiconductor substrate, and to connect diffusion regions of the transistors to gate layers. Typically, the interconnect wiring is built on top of a semiconductor chip, while the device portion is located on the bottom portion of the semiconductor chip.

Modern integrated circuits contain millions of individual transistors and other electronic components, and therefore power must be supplied to a large number of electrical components fabricated in an integrated circuit. This leads to a significant reduction of the semiconductor chip surface by the interconnect wiring that could otherwise be used for active circuit fabrication. Accordingly, the formation of interconnect wiring on a semiconductor device (for example, semiconductor-on-insulator (SOI) device or complementary metal oxide semiconductor (CMOS)) can be difficult as the size of the current devices decrease, and as wiring becomes more complex due to, in part, the formation of a large number of various electronic components on the semiconductor devices, such as p-type and n-type field-effect transistors (PFETs and NFETs, respectively).

Ultrathin body silicon devices are considered viable options for CMOS scaling. Such devices can employ, for example, an extremely thin semiconductor-on-insulator (ET-SOI) layer to form devices therein. However, thin-body SOI transistors need epitaxially grown, raised source/drain regions to achieve a sufficiently low transistor series resistance. Moreover, due to the extreme thinness of the ETSOI layer (e.g., about 6 nm or less), conventionally formed embedded interconnect structures are not a viable means of forming interconnect wiring structures. Consequently, it is a significant challenge to couple interconnect wiring structures into such ultrathin devices.

Turning now to an overview of the aspects of the invention, embodiments of the invention address the above-described shortcomings of the prior art by providing a semiconductor wafer with a bottom local interconnect structure to reduce the overcrowding of wiring and a method of fabricating the same. It is to be understood that the disclosed embodiments are merely illustrative of the claimed structures and methods that may be embodied in various forms. Moreover, while planar FET device is used to describe the semiconductor device of the present invention and its fabrication process, embodiments of the present invention can apply to any type of planar transistors, such as FinFET, Nanosheet FETs, and the like.

Turning now to a more detailed description of aspects of the present invention, FIGS. 1-6 depict cross-sectional views of a portion of a semiconductor wafer/structure 100 after fabrication operations for forming on/in the structure 100 an arrangement of IC components (e.g., FETs) having a bottom interconnect structure 606 (shown in FIG. 6) according to embodiments of the invention. More specifically, FIG. 1 depicts a cross-sectional view illustrating the structure 100 that results from performing initial fabrication operations in accordance with embodiments of this invention. As shown in FIG. 1, known fabrication operations have been used to form the wafer/structure 100 having a bulk substrate 102, a buried oxide (BOX) layer 104, and a channel layer 106, configured and arranged as shown. In embodiments of the invention, the substrate 102 is highly doped. In accordance with aspects of the invention, a material can be considered highly doped when the material has a dopant concentration of about $3\times10^{17}$ atoms/cm$^3$ or greater. In embodiments of the invention, the substrate 102 can be doped by ion implantation, plasma doping, plasma immersion, in-situ doped epitaxial growth with masking and the like. In embodiments of the invention, the substrate 102 can be doped with a first dopant configured to define a first substrate region 111, along with a second dopant configured to define a second substrate region 112. In embodiments of the invention, the first dopant can be a p-type dopant (e.g., boron, gallium, indium), and the second dopant can be an n-type dopant (e.g., phosphorus, arsenic, antimony). The first substrate regions 111 can be used as a basis for the formation of a p-type transistor or, more particularly, a p-type field effect transistor (PFET). Similarly, the second substrate regions 112 can be used as a basis for the formation of an n-type transistor or, more particularly, an n-type field effect transistor (NFET). In embodiments of the invention, the substrate 102 is substantially planarized and can be a semiconductor material including, but not limited to, silicon (Si), silicon germanium (SiGe), silicon carbide (SiC), silicon-germanium-carbon (SiGeC) or other like semiconductor material. Similarly, in embodiments of the invention, the channel layer 106 is substantially planarized and can be a semiconductor material including, but not limited to, Si, SiGe, SiC, SiGeC, or other like semiconductor material.

Figure 2:
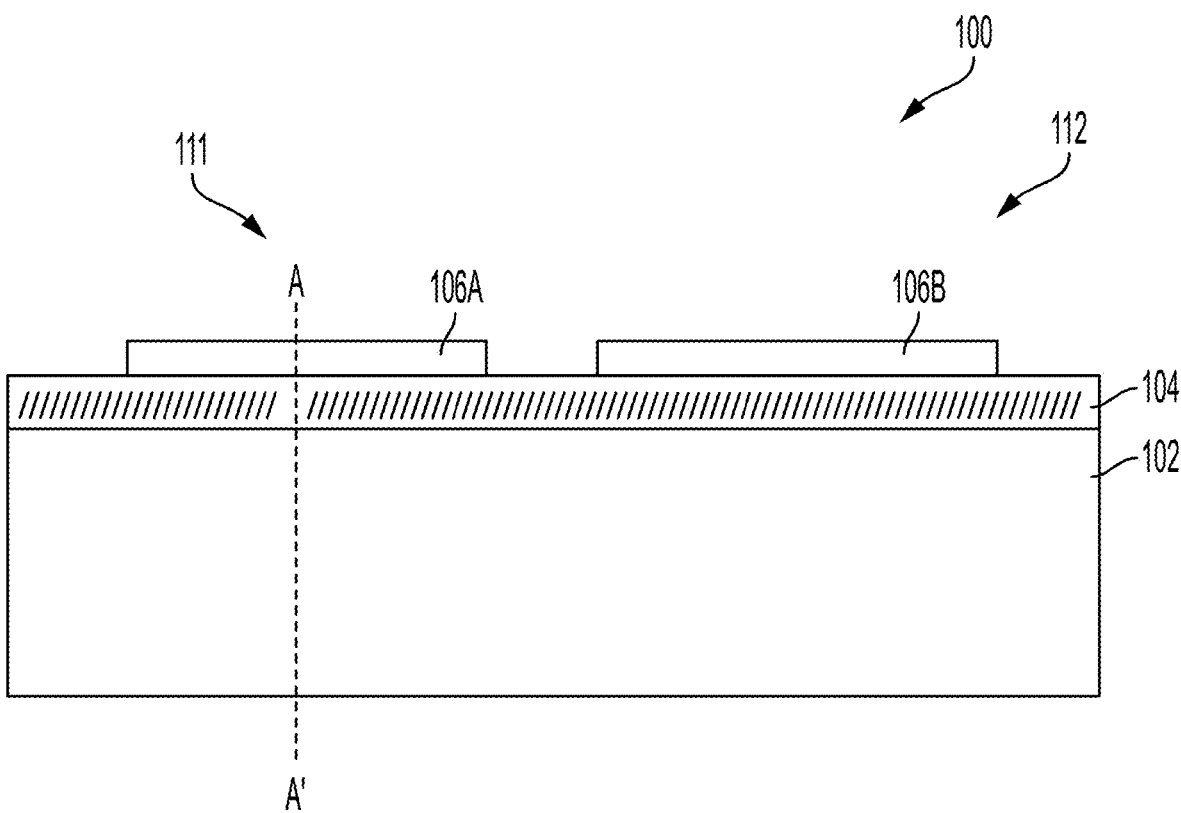

In FIG. 2, known semiconductor fabrication operations have been used to remove selected portions of the channel layer 106 (shown in FIG. 1) to form a PFET active channel region 106A and an NFET active channel region 106B. In embodiments of the invention, the selected portions of the channel layer 106 can be removed using any suitable etching process configured to selectively etch the material of the channel layer 106 without significantly etching the material of the BOX layer 104.

Figure 3:
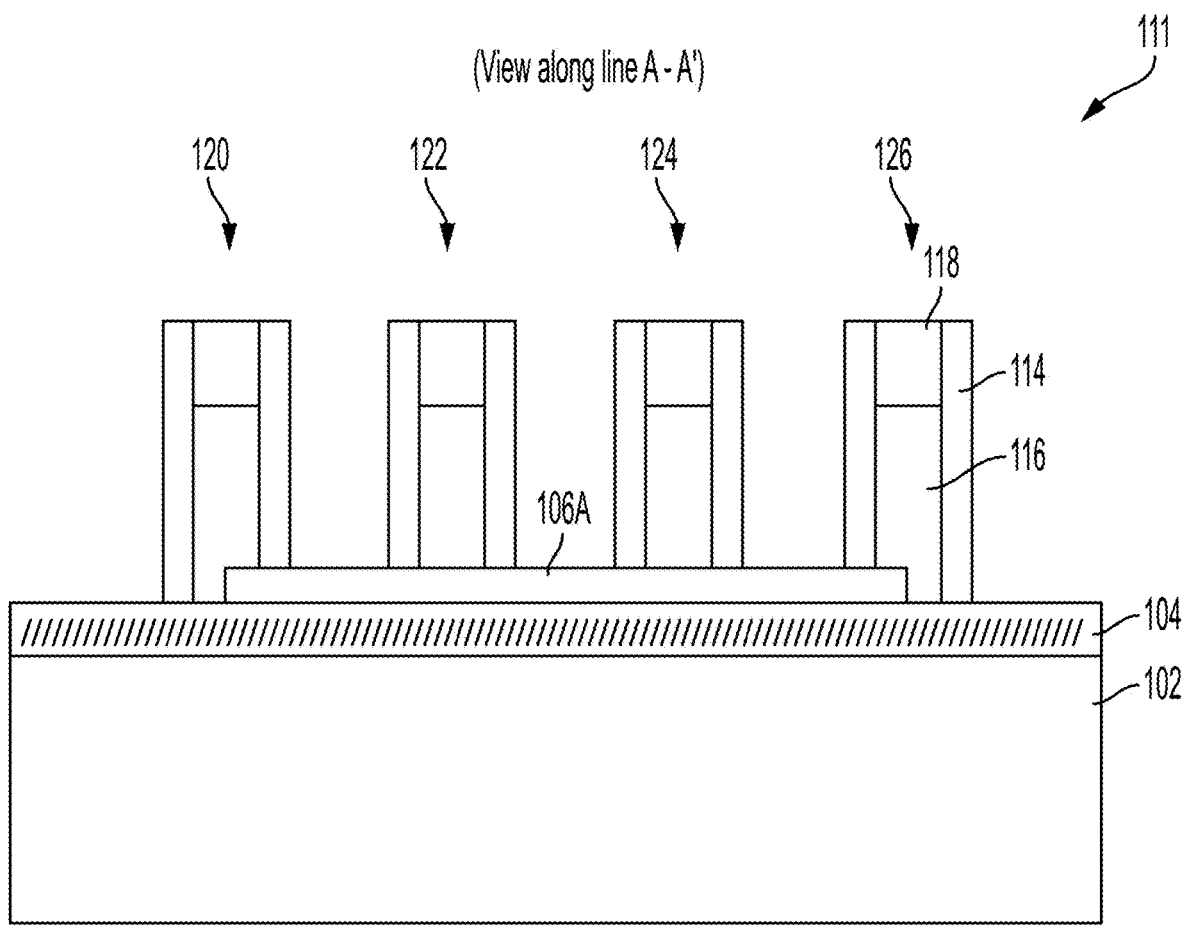

FIG. 3 depicts a cross-sectional view of the structure 100 taken along line A-A' of FIG. 2, which focuses on fabrication operations performed in the first substrate region 111 to form PFET devices. It is understood that the fabrication operations described herein as applying to the first substrate region 111 apply equally to the second substrate region 112 with appropriate modifications to account the differences between NFET devices and PFET devices. In FIG. 3, known fabrication operations have been used to form dummy gate stacks 120, 122, 124, 126 over and around the PFET active channel region 106A in the first substrate region 111. The dummy gate stacks 120, 122, 124, 126 can be formed using fabrication operations that include dummy gate oxidation, dummy poly deposition, poly screen oxidation (or poly oxide cap deposition), silicon nitride (SiN) deposition, gate lithography, gate RIE, and resist strip. More specifically, in embodiments of the present invention, each of the dummy gate stacks 120, 122, 124, 126 each include a dummy gate 116 that can be formed by depositing a dielectric layer over the structure 100 shown in FIG. 2, and depositing a polysilicon layer over the dielectric layer. A lithography and gate etch process removes unnecessary portions of the stacked layers to leave dummy gates 116 having a gate oxide (not pictured) and a polysilicon layer (not pictured). The dummy gates 116 can be formed from any material that can be etched selectively to the underlying upper semiconductor layer, for example, an oxide or polysilicon.

Gate spacers 114 are formed on sidewalls of the dummy gates 116 by any suitable process. The gate spacers 114 can be formed by deposition and etching techniques. Suitable spacer materials include, but are not limited to, oxides such as silicon dioxide (SiO$_2$), nitrides such as silicon nitride (SiN), and/or low-K materials such as carbon-doped oxide materials containing silicon (Si), carbon (C), oxygen (O), and hydrogen (H) (SiCOH) or siliconborocarbonitride (SiBCN). The term "low-k" as used herein refers to a material having a relative dielectric constant (k) which is lower than that of silicon nitride.

Each of the dummy gates 116 further includes gate cap 118, which can be formed of any suitable material, including, for example, silicon oxide, silicon nitride, silicon oxynitride, boron nitride, or any suitable combination of those materials. In embodiments of the invention, the gate caps 118 are formed of SiN. In subsequent fabrication operations, the dummy gates 116 can be removed from between the gate spacers 114 by, for example, an anisotropic vertical etch process such as reactive ion etch (RIE). This creates an opening between the gate spacers 114 where a metal gate can then be formed between the gate spacers 114. Optionally, the dummy gates 114 can be actual gates, and are not subsequently replaced with a replacement gate.

Figure 4:
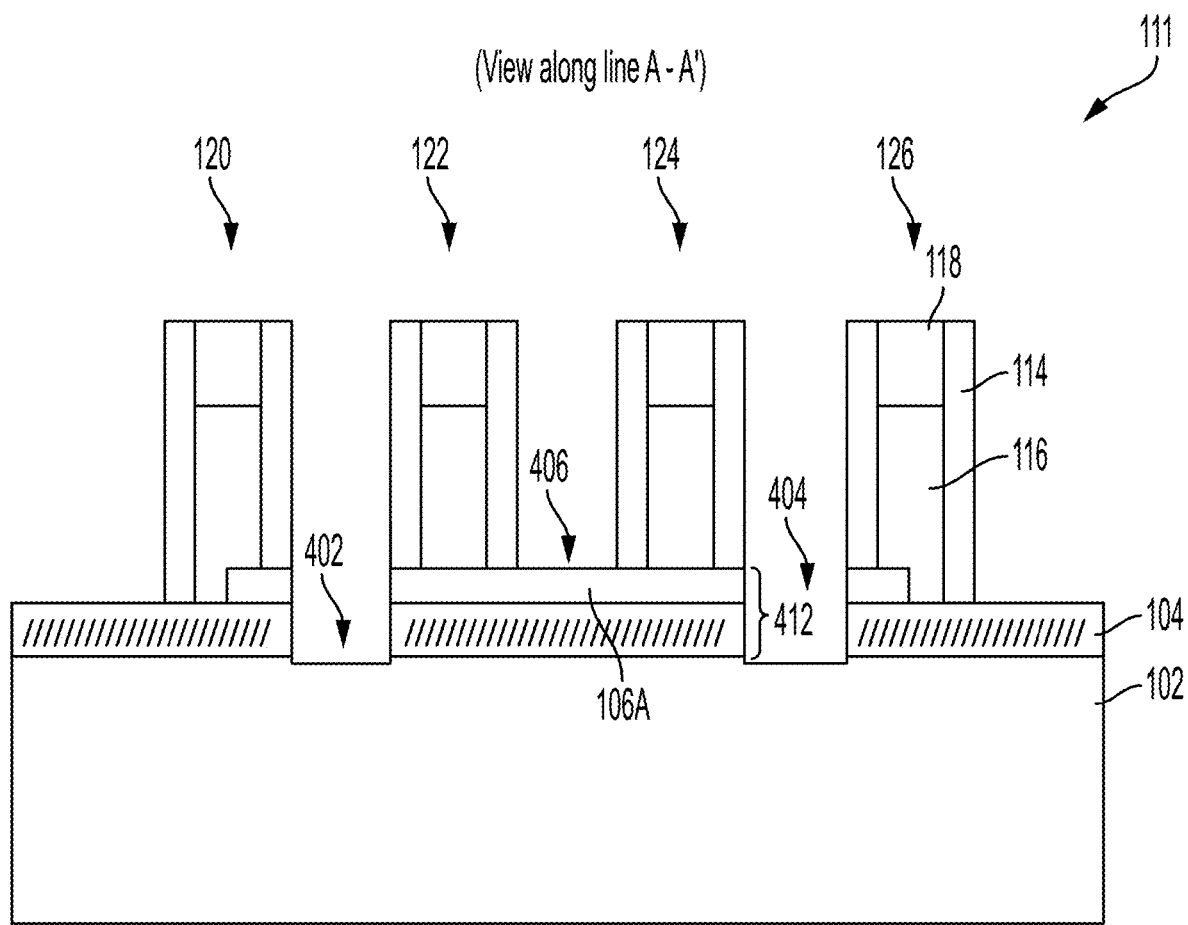

In FIG. 4, known fabrication operations have been used to form source and/or drain (S/D) trench regions 402 and 404. The S/D trench region 402 is formed between the dummy gate stacks 120 and 122. The S/D trench region 404 is formed between the dummy gate stacks 124 and 126. The S/D trench regions 402, 404 are formed by recessing the active channel region 106A and the BOX layer 104 to the doped substrate 102 by using RIE. Accordingly, as illustrated in FIG. 4, the S/D trench regions 402, 404 are formed between the dummy gate stacks 120, 122 and the dummy gate stacks 124 and 126, respectively, and terminate sufficiently deep to expose a top surface of the doped substrate 102. A trench region 406 is formed between the dummy gate stacks 124 and 126, and terminates sufficiently deep to expose a top surface of the active channel region 106A. Accordingly, as shown in FIG. 4, after recessing the active channel region 106A to form the S/D trench regions 402, 404, a structure 412 is formed between the S/D trench regions 402, 404. The structure 412 includes the portions of the buried oxide (BOX) layer 104 and the active channel region 106A positioned between the S/D trench regions 402, 404.

Figure 5:
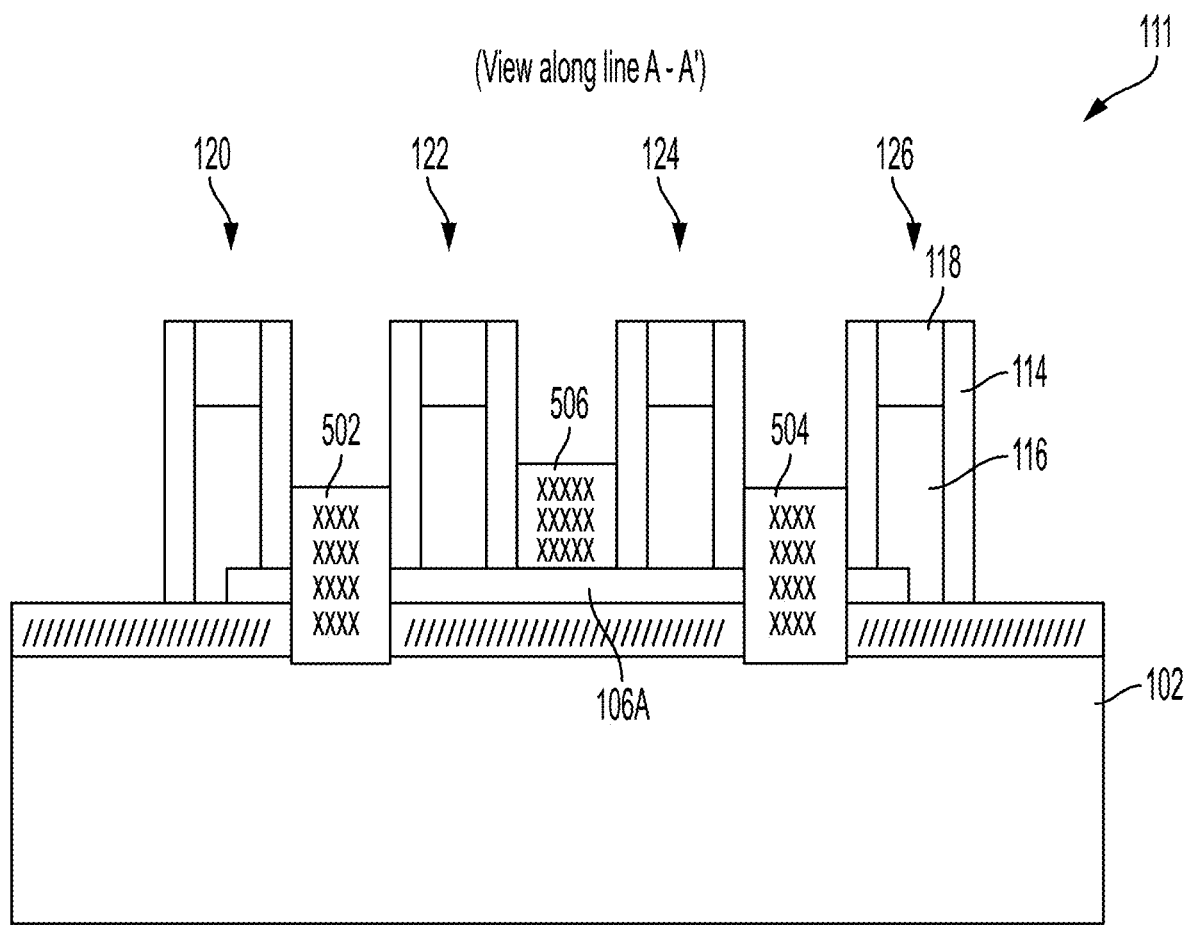

In FIG. 5, known fabrication operations (e.g., epitaxial growth) have been used to form S/D structures 502, 504 in the S/D trench regions 402, 404 (shown in FIG. 4). Known fabrication operations (epitaxial growth) have also been used to form a source or drain (S/D) structure 506 in the trench region 406 between the dummy gate stacks 122, 124. The epitaxial formation of the S/D structures 502 and 504, and the S/D structure 506 can include a number of high-temperature steps (e.g., implants, doped epitaxy growth, and anneals). In embodiments of the present invention, the structures 502, 504 and 506 are formed by epitaxial growth. In the first substrate region 111, which is used as a basis for the formation of PFET, the S/D structures 502 and 504 can be doped to include silicon germanium (SiGe) material, where the atomic concentration of germanium (Ge) can range from approximately 10% to approximately 80%. The S/D structures 502 and 504 can be doped by any known p-type dopant used in the fabrication of PFET devices such as, for instance, boron. The S/D structures 502, 504 can also be doped by using other known processes, for example, an ion implantation process.

Figure 6:
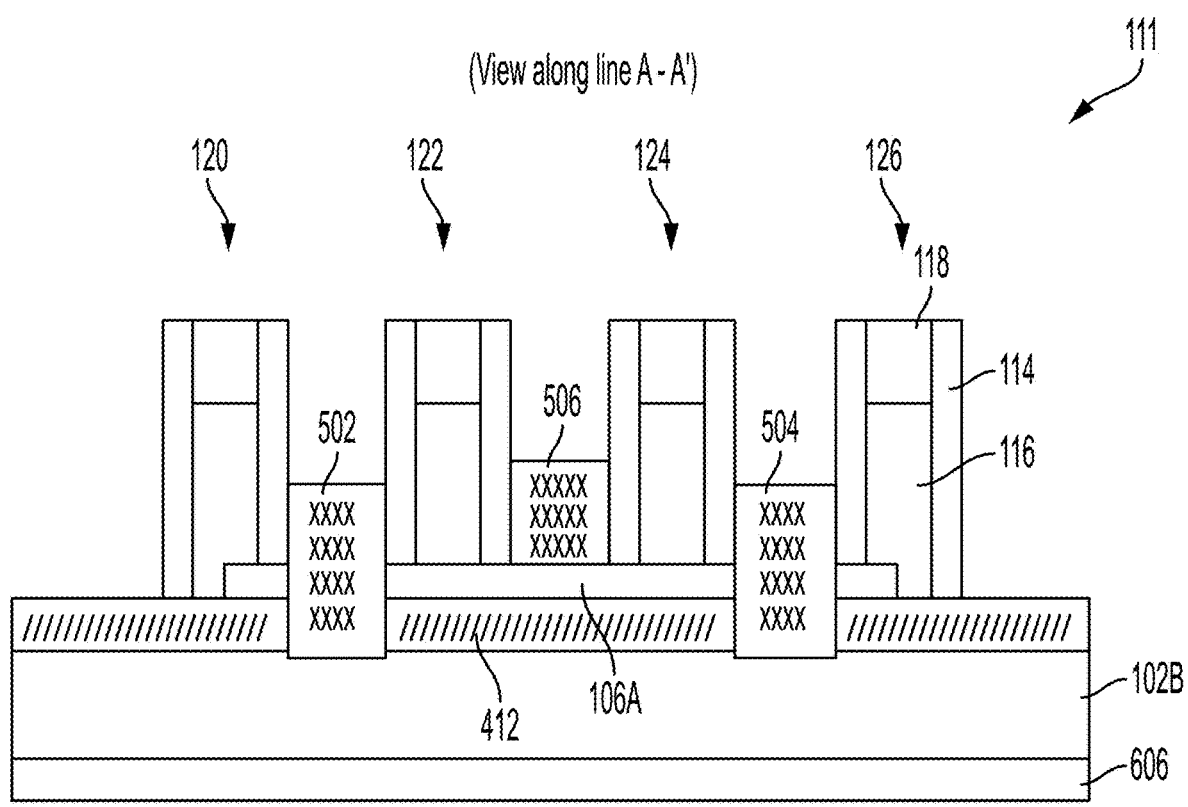

Accordingly, as shown in FIGS. 5 and 6, the S/D structures 502 and 504 are electrically connected to the substrate 102 that is highly doped. On the other hand, the S/D structure 506 is isolated from the substrate 102 by the structure 412 (shown in FIG. 6).

It is understood that the same steps described in FIGS. 3-6 can apply to the second substrate regions 112 to form an NFET device. The S/D structures (not shown) in the second substrate regions 112 can include carbon-doped silicon (Si:C) material, where the atomic concentration of carbon (C) can range from approximately 0.2% to approximately 3.0%. An epitaxial layer of the S/D structures in the second substrate regions 112 can be doped by any known n-type dopant used in the fabrication of NFET devices such as, for instance, phosphorus or arsenic.

As illustrated in FIG. 5, upon completion of the step described herein, bottoms of the S/D structures 502 and 504 are electrically connected to the substrate 102. According to embodiments of the invention, the substrate 102 is doped to the same polarity as the S/D structures 502 and 504. The substrate 102 can serve as a power supply voltage (VDD) contact when the S/D structures 502 and 504 are formed as a PFET device. When the same steps described in FIGS. 3-6 are applied to the second substrate regions 112 to form an NFET device, the substrate 102 can serve as ground (GND) contact.

In FIG. 6, the substrate 102 is thinned down from the original thickness to the desired thickness of a thinned substrate 102B, for example, thickness that is suitable for ultrathin body silicon devices, using oxidation and HF oxide etch. A low-temperature oxidation, such as plasma-assisted, slot plane antenna (SPA) oxidation, can be performed to minimize the thermal budget to avoid unwanted additional dopant diffusion. This oxidation thinning to the target thickness can be done with a high level of thickness control and uniformity.

Further, as shown in FIG. 6, a contact 606 is formed on the thinned substrate 102B on the side that is opposite to the dummy gate stacks 120, 122, 124 and 126. Middle of the line and back end of the line (BEOL) processes known in the art can be performed to complete the semiconductor chip (not shown). After completion of the processing, the S/D structures 502, 504 are electrically connected to the substrate 102, while the S/D structure 506 is isolated from the substrate 102 by the structure 412 (shown in FIG. 5)

Referring now to FIGS. 7-14, which illustrate an alternative embodiment of the present disclosure where both VDD and GND contacts can be formed on a backside of a wafer. In the following discussion "front-side" refers to the surface on which an integrated device 2100 is made prior to flipping over the FETs, and "back-side" refers to the surface that is to become the top surface after the device is turned over.

Figure 7:
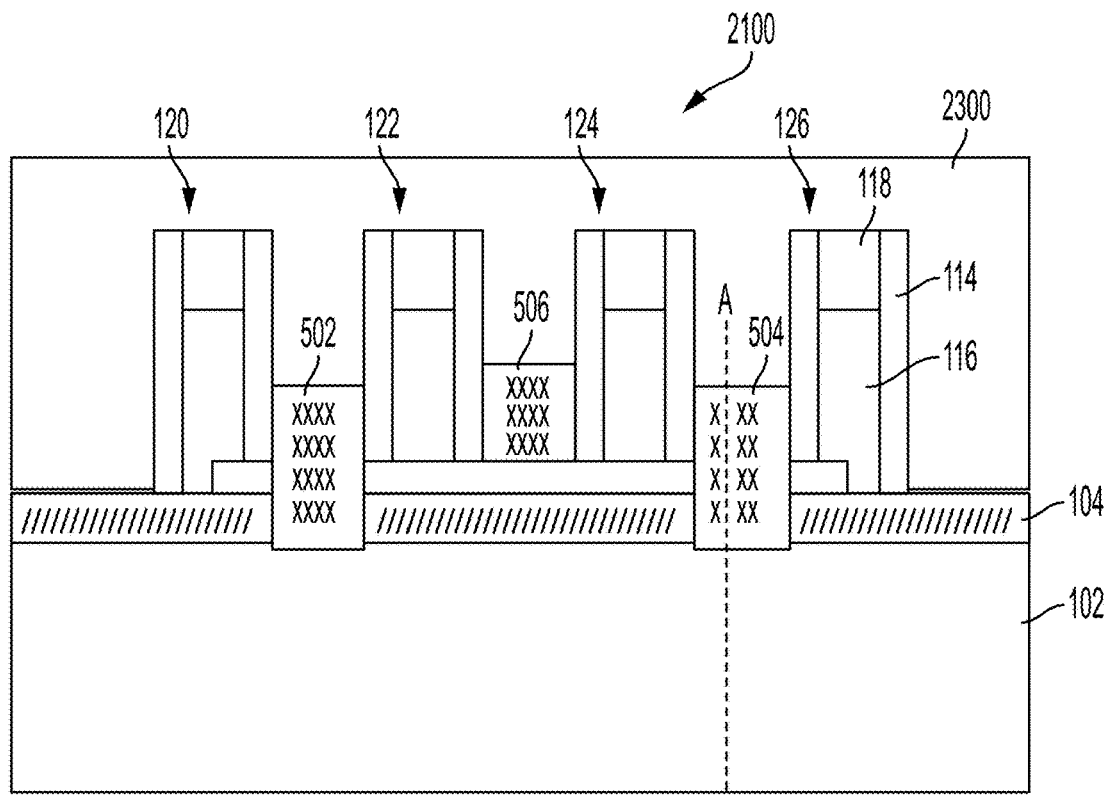

FIG. 7 illustrates the front-side of the integrated device 2100 after an initial set of fabrication operations described in FIGS. 1-5. More specifically, FIG. 7 illustrates the S/D structure 502 formed between the dummy gate stacks 120 and 124, and the S/D structure 504 formed between the dummy gate stacks 124 and 126. Each of the bottoms of the S/D structures 502, 504 is connected to the highly doped substrate 102. An interlayer dielectric (ILD) material 2300 is deposited in empty regions that surround the dummy gate stacks 120, 122, 124, 126, as well as the SD structures 502, 504, 506.

Figure 8:
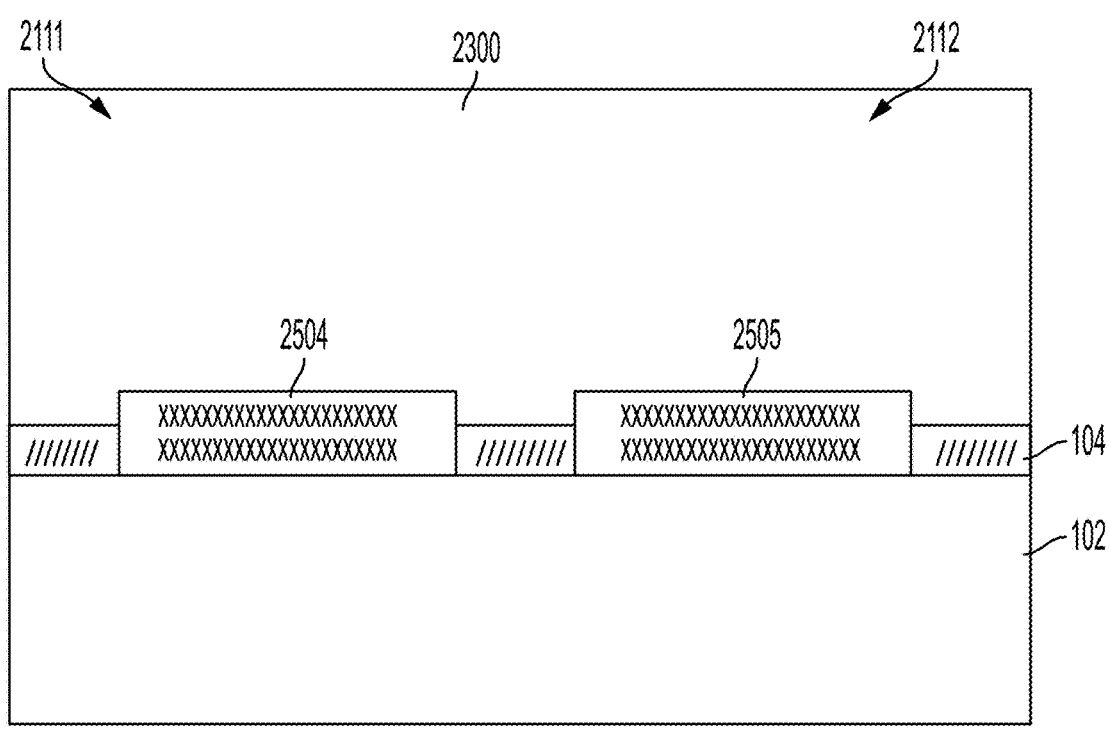

FIG. 8 depicts a cross-sectional view of FIG. 7, taken along line A-A' of FIG. 7, that illustrates fabrication operations performed in a PFET active region 2111 and an NFET active region 2112. In the PFET active region 2111, a S/D structure 2504 is doped with a first dopant, such as a p-type dopant (e.g., boron, gallium, indium). In the NFET region 2112 a S/D structure 2505 is doped with a second dopant, such as a n-type dopant (e.g., e.g., phosphorus, arsenic, antimony). Accordingly, the PFET active region 2111 can be used for as a basis for formation of a PFET device, while the NFET active region 2112 can be used for as a basis for formation of a NFET device.

Figure 9:
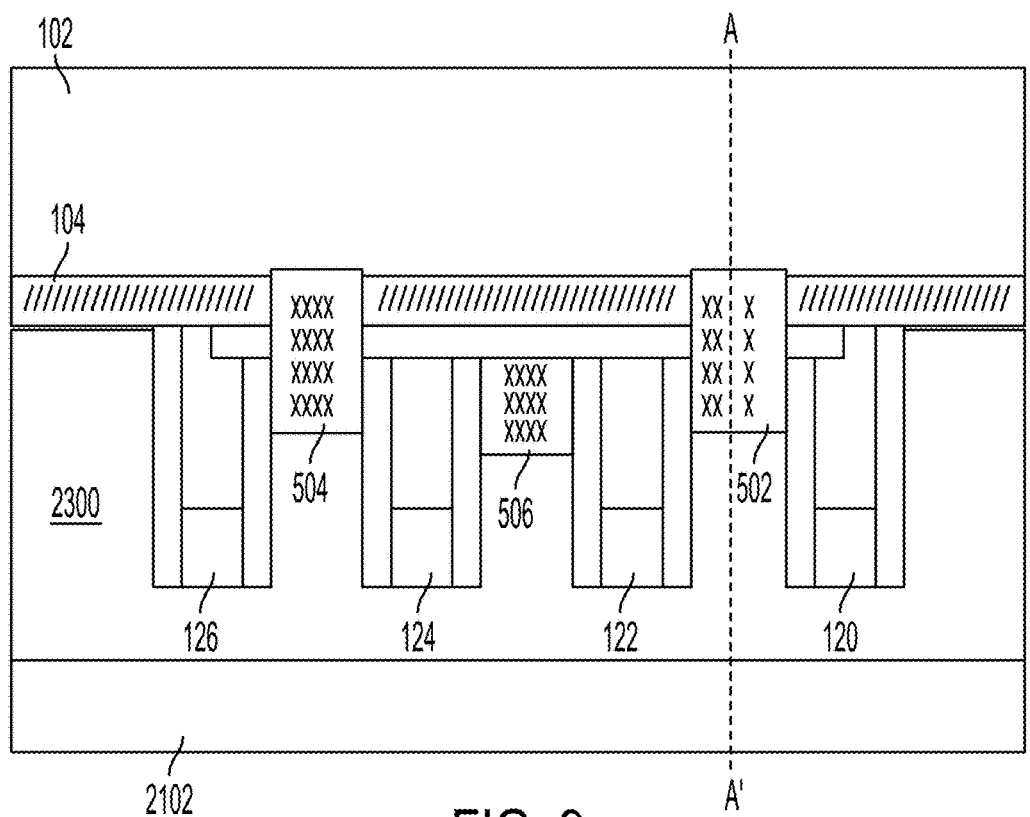

In FIG. 9, the wafer has been flipped up-side down and bonded to a host substrate 2102. The top service of the host substrate 2102 is typically $SiO_2$ or silicon, but other materials including, for example, copper (Cu) where found to allow good bonding at relatively low temperatures.

Figure 10:
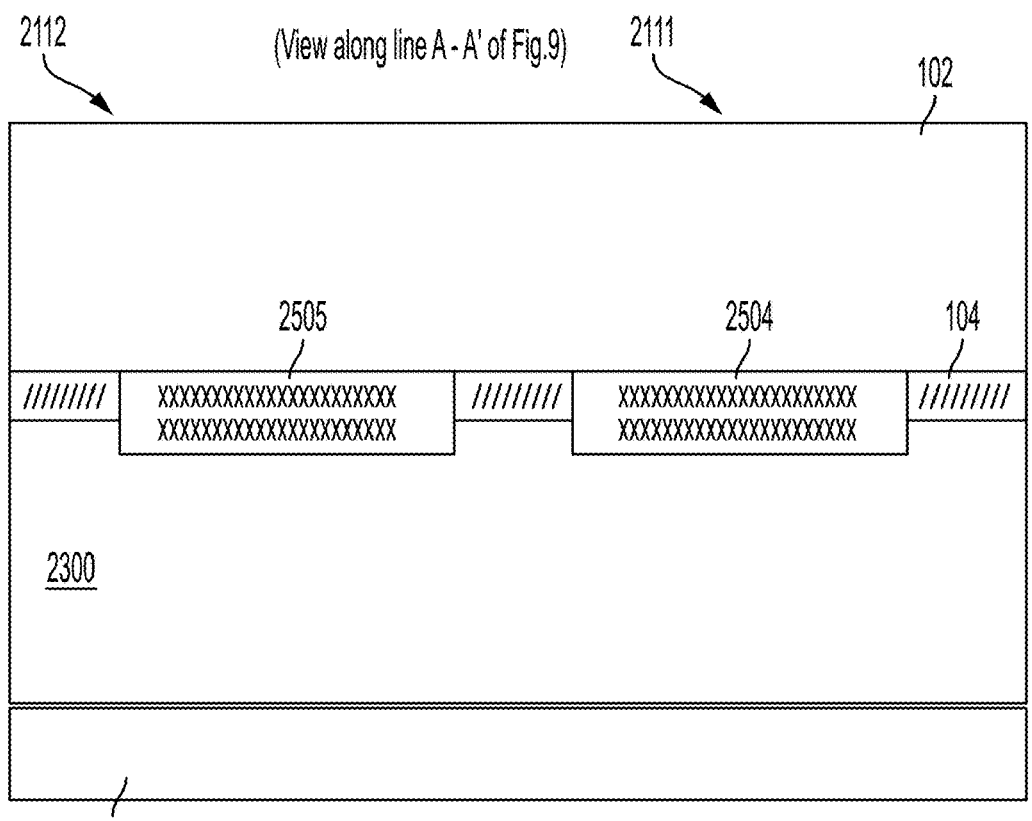

FIG. 10 depicts a cross-sectional view of FIG. 9, taken along line A-A' of FIG. 9, which illustrates the PFET active region 2111 and the NFET active region 2112, and the S/D structures 2504 and 2505 after the wafer has been flipped.

Figure 11:
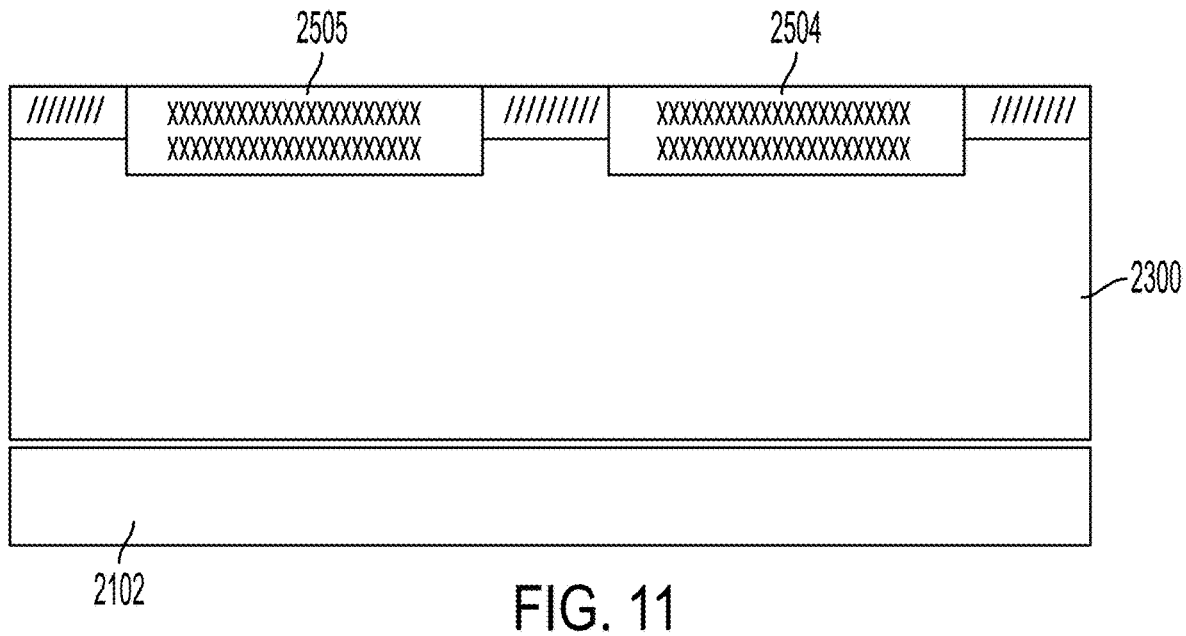

In FIG. 11, the substrate 102, also referred to as the donor substrate, has been removed, leaving the top device region attached to the host substrate 2102.

Figure 12:
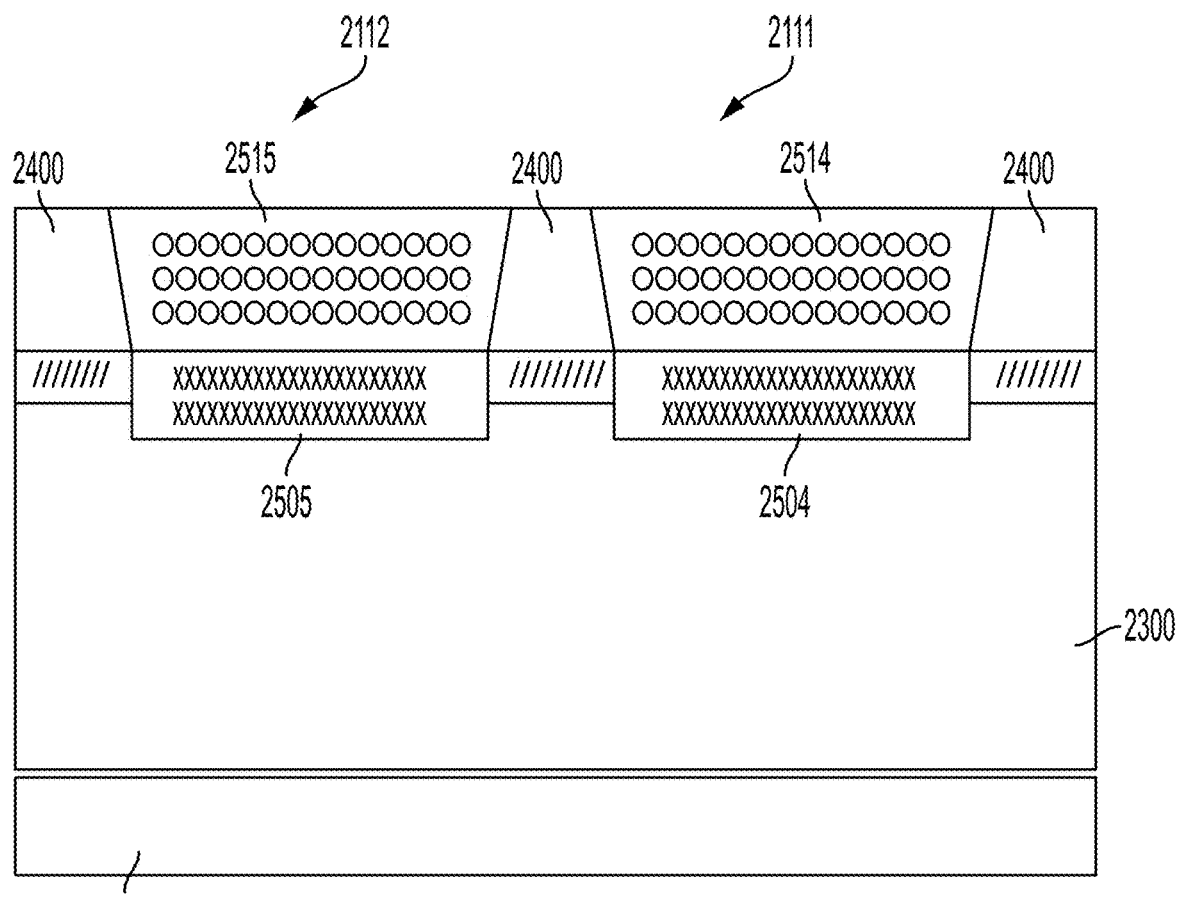

In FIG. 12 known fabrication operations have been used to form a GND contact 2515 and a VDD contact 2514. According to embodiments of the invention, the GND contact 2515 can be grown by n-type in-situ dope epitaxial growth processes (e.g., in-situ phosphorus doped silicon epitaxy). The GND contact 2515 is formed to be in contact with the n-doped S/D structures 2505 in the NFET active region 2112. The VDD contact 2514 can be grown by p-type in-situ dope epitaxial growth processes (e.g., boron doped silicon or silicon germanium). The VDD contact 2514 is formed to be contact with the p-doped S/D structures 2504 in the PFET active region 2112. As further shown in FIG. 12, an ILD material 2400 is deposited in empty regions surrounding the GND contact 2515 and the VDD contact 2514. The ILD material 2400 is substantially coplanar with the upper surfaces of the GND contact 2515 and the VDD contact 2514 following a chemical mechanical polishing (CMP) process.

Figure 13:
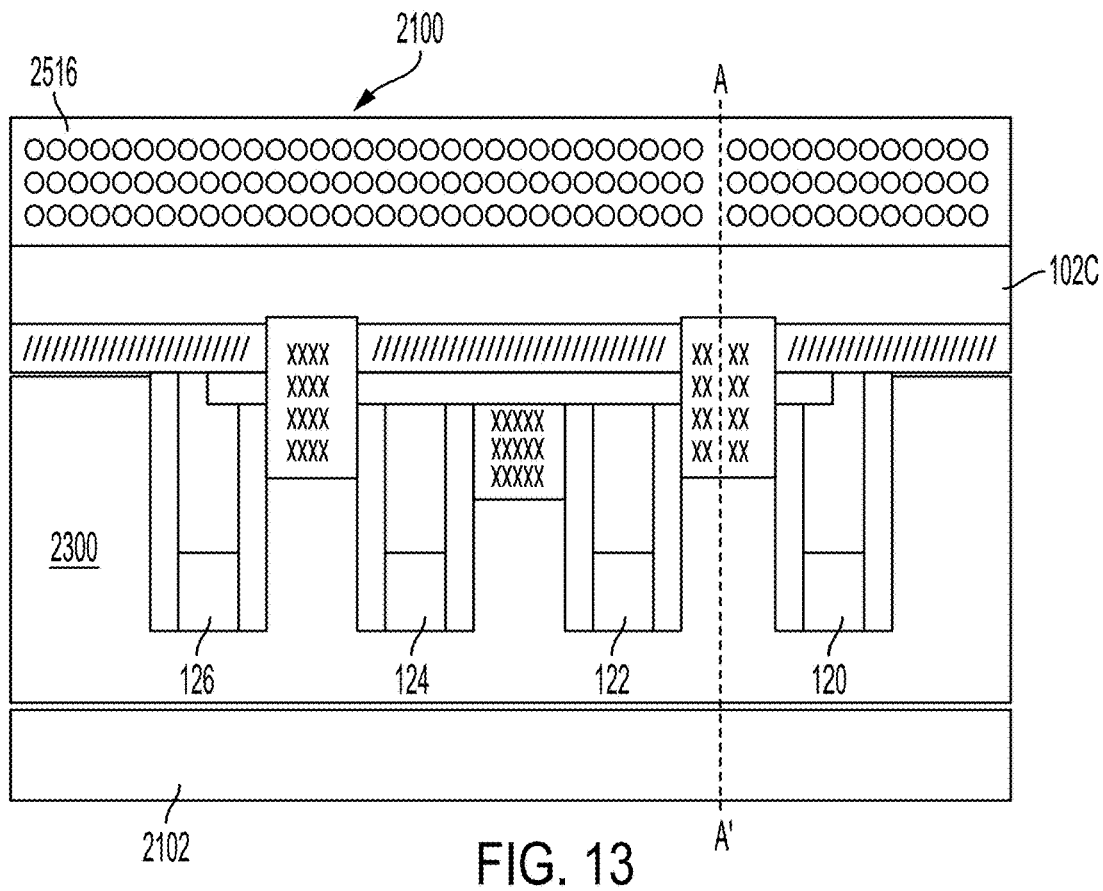

In embodiments of the present disclosure, as illustrated in FIG. 13, the substrate 102 can be thinned down from the original thickness to form a thinned substrate 102C, rather than being fully removed as shown in FIG. 11. A contact layer 2516 is formed by epitaxy over the thinned down substrate 102C.

Figure 14:
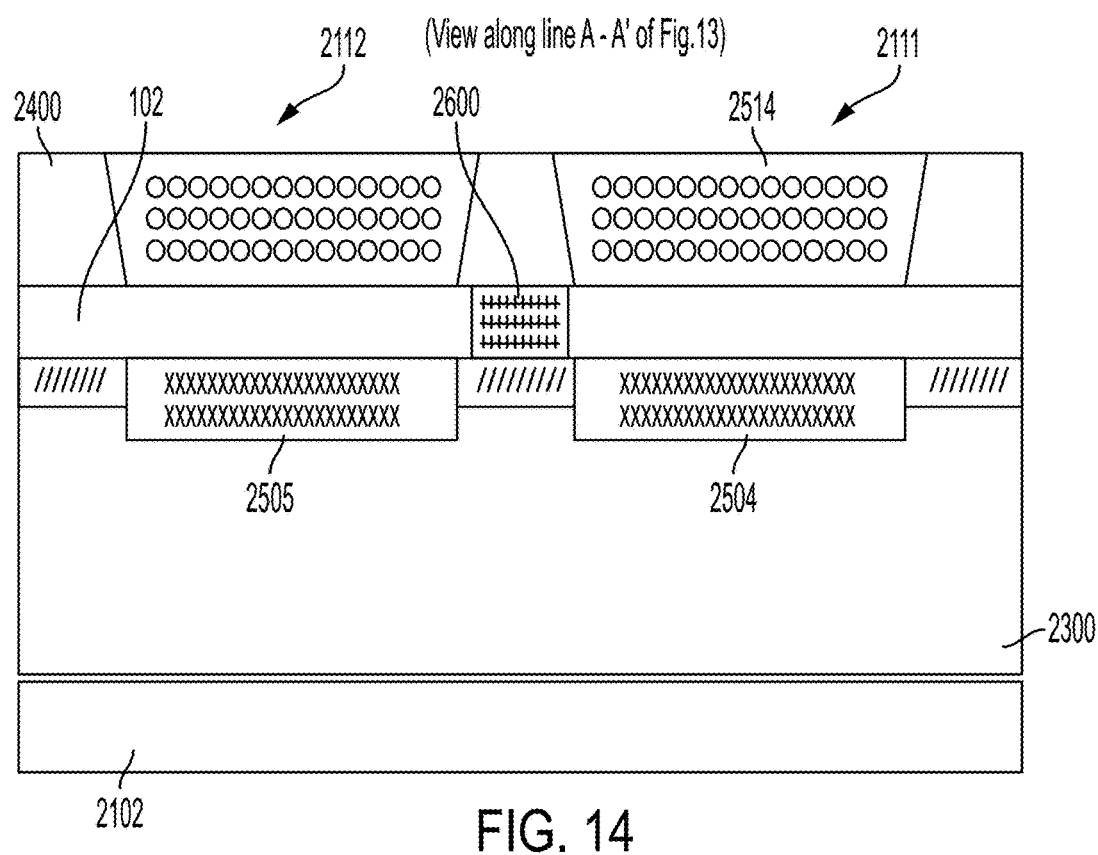

FIG. 14 depicts a cross-sectional view of FIG. 13, taken along line A-A' of FIG. 13. In FIG. 14, a shallow trench isolation (STI) feature 2600 is formed in the thinned substrate 102C to separate the active regions from one another. In other words, the STI feature 2600 is disposed to separate the NFET active region 2112 from the PFET active region 2111. The STI feature 2600 has an upper surface that is substantially coplanar with the upper surface of the thinned substrate 102C.

Figure 15:
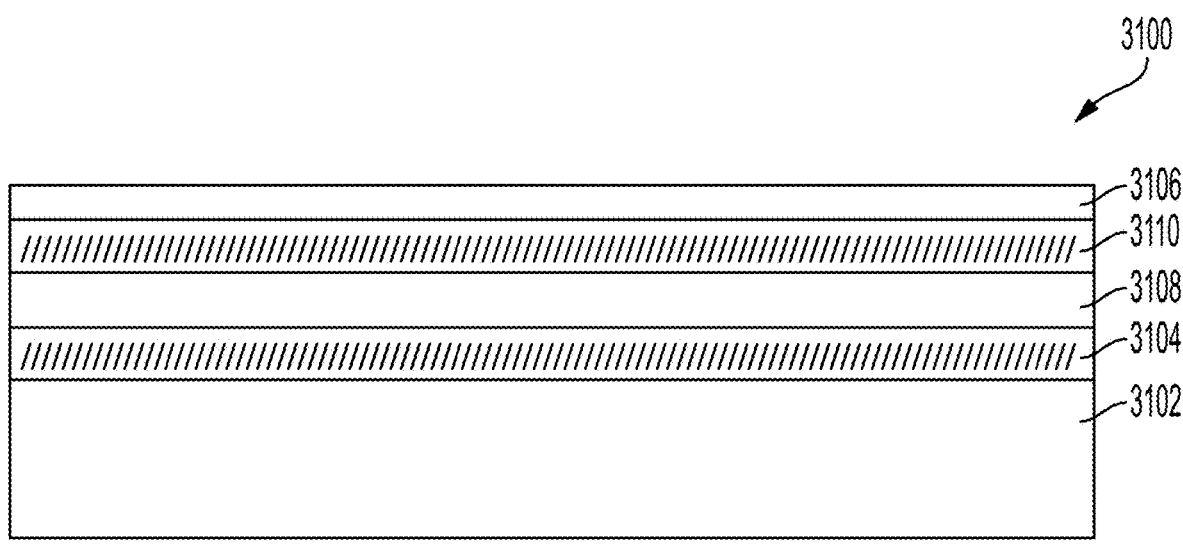

Referring now to FIGS. 15-20, which show another alternative embodiment of the present disclosure, where a wafer includes two buried oxide layers. More specifically, FIG. 15 depicts a cross-sectional view of a structure 3100 that results from performing initial fabrication operations according to embodiments of the invention. As shown in FIG. 15, known fabrication operations have been used to form the structure 3100 having a bulk substrate 3102, a first buried oxide (BOX) layer 3104 formed on the bulk substrate 3102. A buried substrate layer 3108 is formed over the first buried oxide (BOX) layer 3104. The buried substrate layer 3108 can be silicon. A second buried oxide (BOX) layer 3110 is formed over the buried substrate layer 3108. A channel layer 3106 is formed above the second buried oxide (BOX) layer 3110. According to embodiments of the invention, the substrate 3102 is highly doped. In accordance with aspects of the invention, a material can be considered highly doped when the material has a dopant concentration of about $3 \times 10^{17}$ atoms/cm$^3$ or greater. In embodiments of the invention, the substrate 3102 can be doped by ion implantation, plasma doping, plasma immersion, in-situ doped epitaxial growth with masking and the like.

Figure 16:
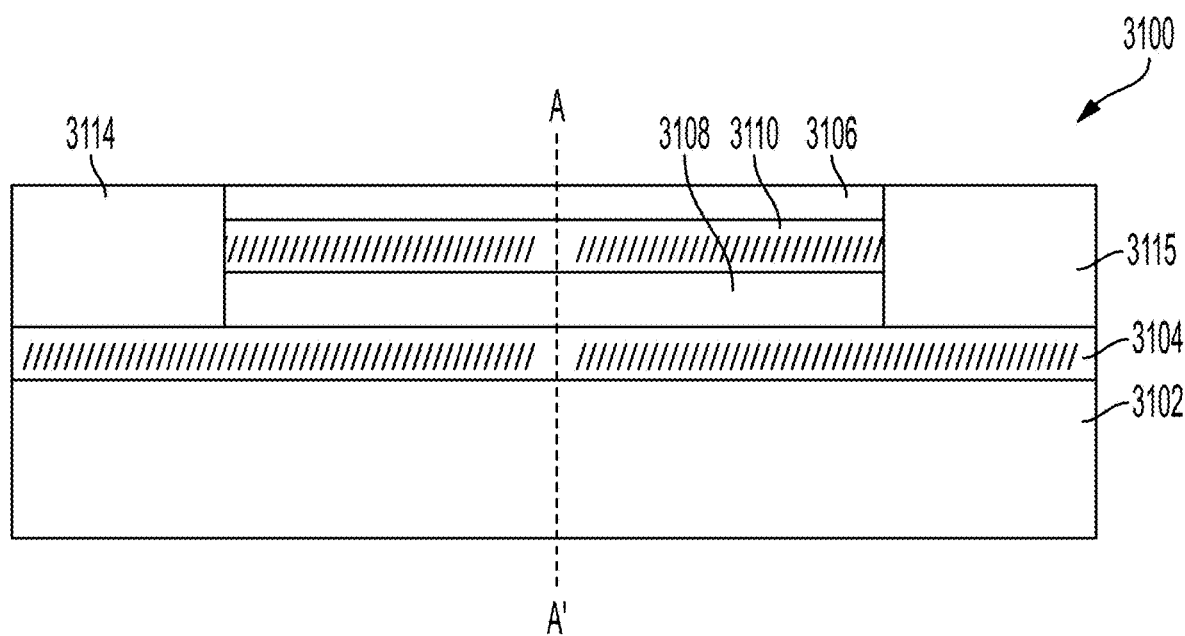

In FIG. 16, shallow trench isolation (STI) features 3114, 3115 have been formed. The STI features 3114, 3115 have upper surfaces that are substantially coplanar with the upper surface of the channel layer 3106. The bottom surfaces of the STI features 3114, 3115 are coplanar with the bottom surface of the buried substrate layer 3108. In other words, the STI features 3114, 3115 terminate at the upper surface of the first BOX layer 3104.

Figure 17:
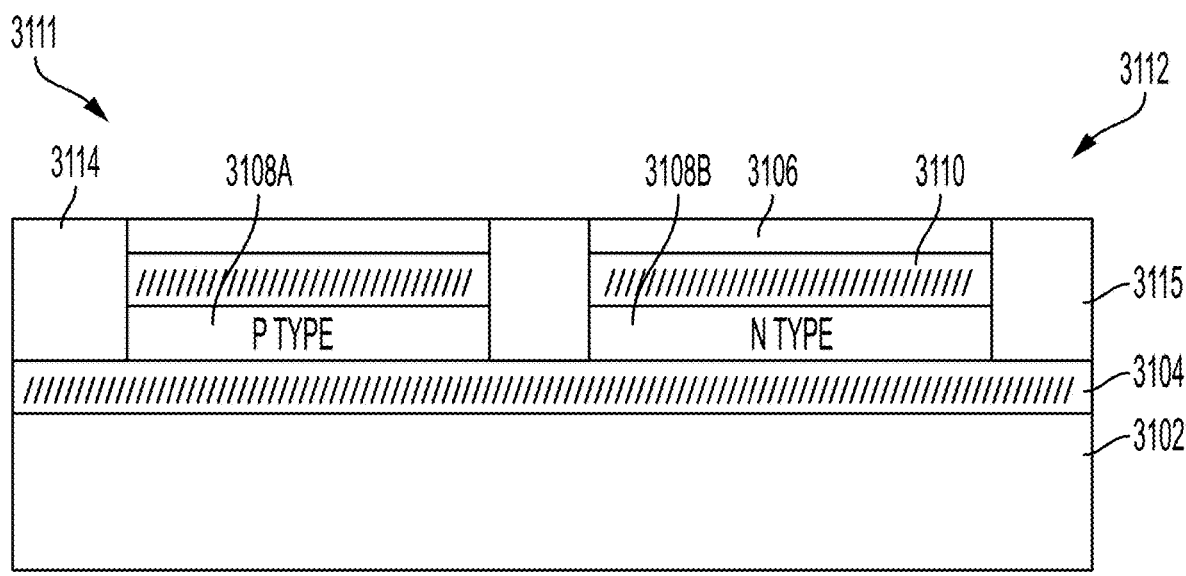

FIG. 17 depicts a cross-sectional view of FIG. 16, taken along line A-A' of FIG. 16, which illustrates a PFET region 3111 and a NFET region 3112. According to embodiments of the invention, the PFET region 3111 is defined by doping the buried substrate layer 3108 with a first dopant, such as a p-type dopant (e.g., boron, gallium, indium) to form a first doped buried substrate layer 3108A and, the NFET region 3112 is defined by doping the buried substrate layer 3108 with a second dopant, such as a n-type dopant (e.g., phosphorus, arsenic, antimony) to form a second doped buried substrate layer 3108B. Accordingly, the PFET active region 3111 can be used for as a basis for formation of a PFET device, while the NFET active region 3112 can be used for as a basis for formation of a NFET device.

Figure 18:
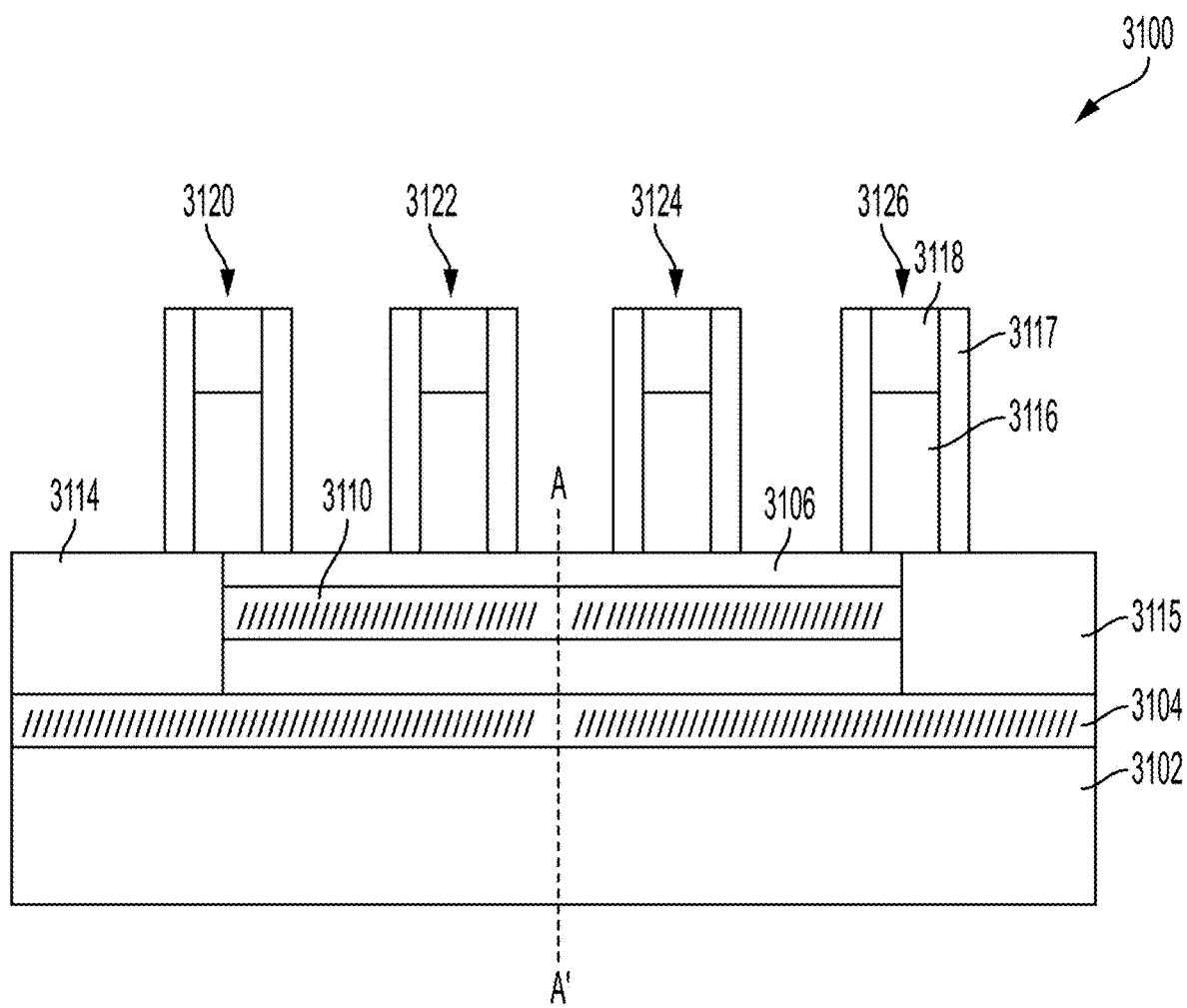

In FIG. 18 known fabrication operations have been used to form dummy gate stacks 3120, 3122, 3124, 3126. The dummy gate stacks 3120, 3122, 3124, 3126 can be formed using fabrication operations that include dummy gate oxidation, dummy poly deposition, poly screen oxidation (or poly oxide cap deposition), silicon nitride (SiN) deposition, gate lithography, gate ME, and resist strip. More specifically, in embodiments of the present invention, each of the dummy gate stacks 3120, 3122, 3124, 3126 includes a dummy gate 3116 that can be formed by depositing a dielectric layer over the structure 3100 shown in FIG. 16, and depositing a polysilicon layer over the dielectric layer. A lithography and gate etch process removes unnecessary portions of the stacked layers to leave dummy gates 3116 having a gate oxide (not pictured) and a polysilicon layer (not pictured). The dummy gates 3116 can be formed from any material that can be etched selectively to the underlying upper semiconductor layer, for example, an oxide or polysilicon.

Gate spacers 3117 are formed on sidewalls of the dummy gates 3116 by any suitable process. The gate spacers 3117 can be formed by deposition and etching techniques. Suitable spacer materials include, but are not limited to, oxides such as silicon dioxide (SiO$_2$), nitrides such as silicon nitride (SiN), and/or low-K materials such as carbon-doped oxide materials containing silicon (Si), carbon (C), oxygen (O), and hydrogen (H) (SiCOH) or siliconborocarbonitride (SiBCN).

Each of the dummy gates 3116 further includes gate cap 3118, which can be formed of any suitable material, including, for example, silicon oxide, silicon nitride, silicon oxynitride, boron nitride, or any suitable combination of those materials. In embodiments of the invention, the gate caps 3118 are formed of SiN. In subsequent fabrication operations, the dummy gates 3116 can be removed from between the gate spacers 3117 by, for example, an anisotropic vertical etch process such as RIE. This creates an opening between the gate spacers 3117 where a metal gate can then be formed between the gate spacers 3117. Optionally, the dummy gates 3116 can be actual gates, and are not subsequently replaced with a replacement gate.

Figure 19:
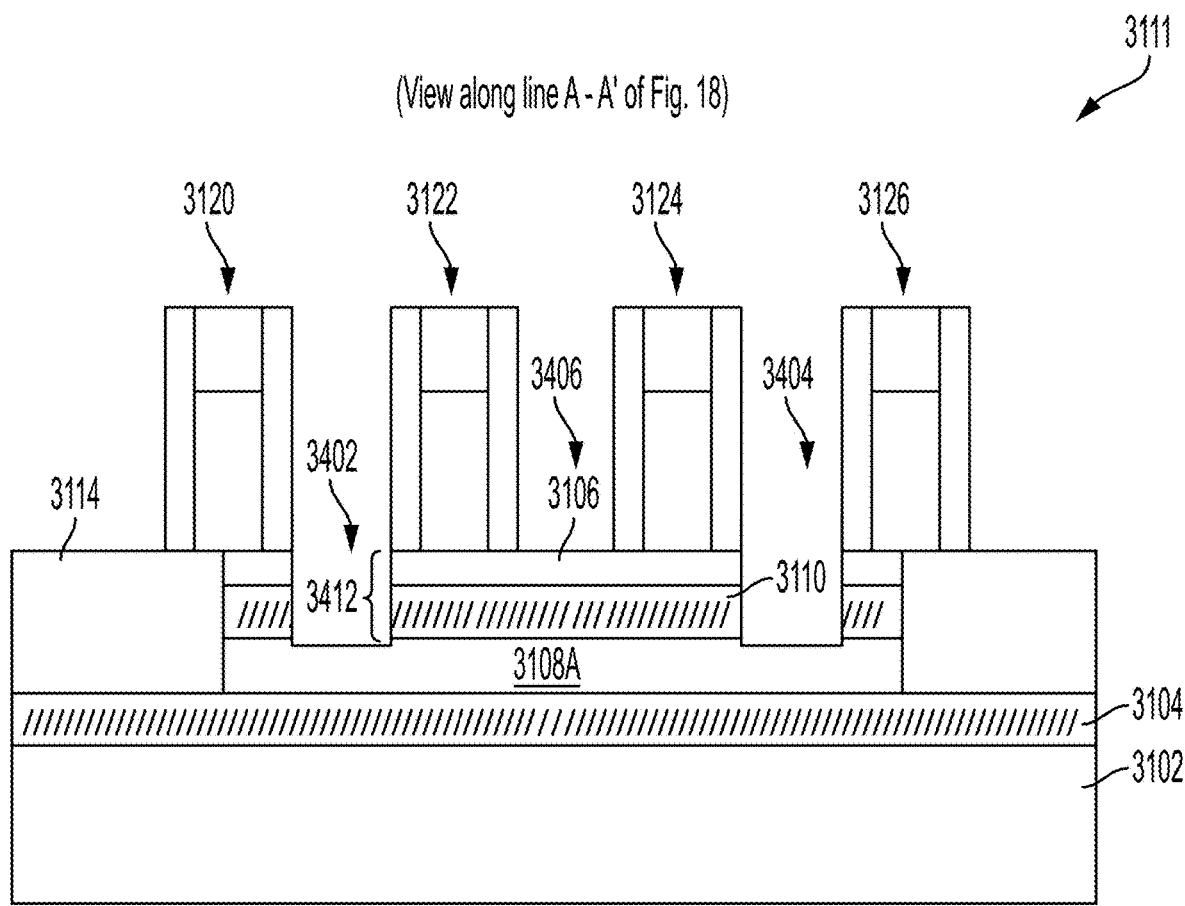

FIG. 19 depicts a cross-sectional view of FIG. 18, taken along line A-A' of FIG. 18. In FIG. 19, known fabrication operations have been used to form source and drain (S/D) trench regions 3402 and 3404. The S/D trench region 3402 is formed between the dummy gate stacks 3120 and 3122. The S/D trench region 3404 is formed between the dummy gate stacks 3124 and 3126. Accordingly, the S/D trench regions 3402, 3404 are formed by recessing the channel layer 3106 and the second buried oxide (BOX) layer 3110 by using RIE and terminate sufficiently deep to expose a top surface of the first doped buried substrate layer 3108A. Further, an S/D trench region 3406 is formed between the dummy gate stacks 3124 and 3126, and terminates at the channel layer 3106. Accordingly, as shown in FIG. 19, a structure 3412 is formed between the S/D trench regions 3402 and 3404. The structure 3412 includes the portions of the buried oxide (BOX) layer 3110 and the channel layer 3106 positioned between the S/D trench regions 3402, 3404.

Figure 20:
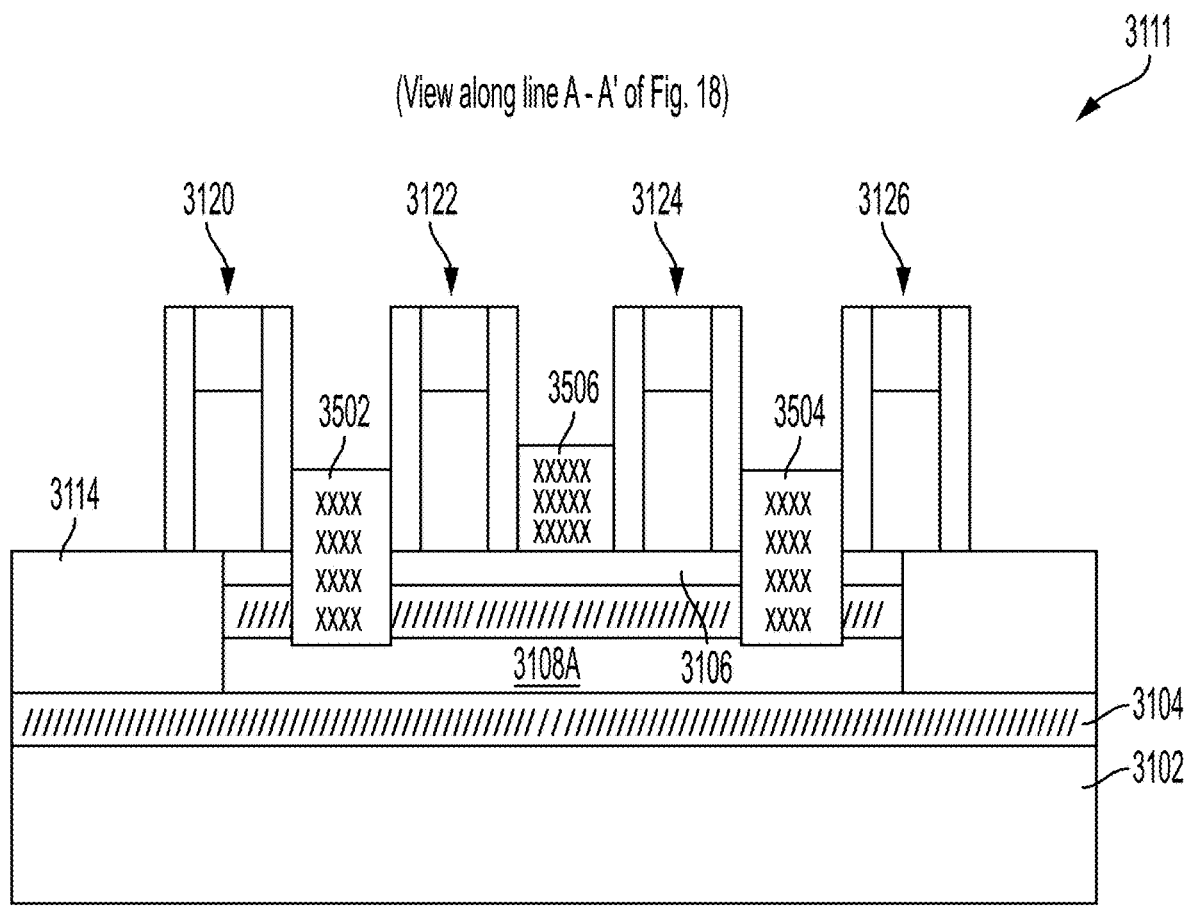

In FIG. 20 known fabrication operations (e.g., epitaxial growth) have been used to form S/D structures 3502 and 3504 in the S/D regions 3402 and 3404. Known fabrication operations (e.g., epitaxial growth) have been used to form an S/D structure 3506 in the region 3406 between the dummy gate stacks 3122 and 3124. The epitaxial formation of the S/D structures 3502, 3504, 3506 can include a number of high-temperature steps (e.g., implants, doped epitaxy growth, and anneals). In embodiments of the present invention, the structures 3502, 3504 and 3506 are formed by epitaxial growth. In the first substrate region 3111, which is used as a basis for the formation of PFET, the S/D structures 3502, 3504 can be doped to include silicon germanium (SiGe) material, where the atomic concentration of germanium (Ge) can range from approximately 10% to approximately 80%. The S/D structures 3502, 3504 can be doped by any known p-type dopant used in the fabrication of PFET devices such as, for instance, boron. The S/D structures 3502, 3504 can also be doped by using other known processes, for example, an ion implantation process. It is understood that the same steps described in FIGS. 15-20 can apply to the second substrate regions 3112 to form an NFET device. The S/D structures (not shown) in the second substrate regions 3112 can include carbon-doped silicon (Si:C) material, where the atomic concentration of carbon (C) can range from approximately 0.2% to approximately 3.0%. An epitaxial layer of the S/D structures in the second substrate regions 3112 can be doped by any known n-type dopant used in the fabrication of NFET devices such as, for instance, phosphorus or arsenic.

Upon completion of the step described in the FIGS. 15-20, bottoms of the S/D structures 3502 and 3504 are electrically connected to the first doped buried substrate layer 3108A. On the other hand, the S/D structure 3506 is isolated from the first doped buried substrate layer 3108A by the structure 3412. The semiconductor substrate 3102 can be thinned down from the original thickness to the desired thickness using oxidation and HF oxide etch. A contact (not shown) can be formed on the semiconductor substrate 3102, on the side that is opposite to the dummy gate stacks 3120, 3122, 3124 and 3126. BEOL processes can be performed to complete the semiconductor chip (not shown). After completion of the processing, the S/D structures 3502 and 3504 are electrically connected to the first doped buried substrate layer 3108A, while the S/D structure 3506 is isolated from the first doped buried substrate layer 3108A by the structure 3412 (shown in FIG. 19).

The methods described herein can be used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a (100) orientated crystalline surface can take on a (100) orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate.

In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor wafer comprising:
    a substrate comprising a first substrate region doped with a first dopant and a second substrate region doped with a second dopant;
    a buried oxide (BOX) layer formed on the substrate;
    a channel layer formed above the BOX layer;
    a buried substrate layer;
    a second BOX layer formed between the substrate and the buried substrate layer;
    a first transistor operably disposed on the substrate in the first substrate region;
    a second transistor operably disposed on the substrate in the second substrate region;
    first doped source and drain structures electrically connected to the buried substrate layer in the first substrate region and separated by portions of the channel layer and the BOX layer; and
    second doped source and drain structures electrically connected to the buried substrate layer in the second substrate region and separated by portions of the channel layer and the BOX layer.

2. The semiconductor wafer according to claim 1, wherein the first transistor and the second transistor are isolated by shallow trench isolation.

3. The semiconductor wafer according to claim 1, wherein the first dopant comprises a p-type dopant and the second dopant comprises an n-type dopant.

4. The semiconductor wafer according to claim 1, wherein the buried substrate layer is silicon.

5. The semiconductor wafer according to claim 1, wherein the buried substrate layer comprises a first buried substrate region doped with a p-type dopant and a second buried substrate region doped with n-type dopant.

6. The semiconductor wafer according to claim 1 further comprising a p-type contact formed in the first substrate region and an n-type contact formed in the second substrate region.

7. The semiconductor wafer according to claim 1 further comprising an interlayer dielectric (ILD) disposed around and over the first transistor and the second transistor.

8. The semiconductor wafer according to claim 1, wherein the first transistor and the second transistor are vertical transport field-effect transistors (VTEFT).

9. A method of fabricating a semiconductor wafer, the method comprising:
   providing a substrate comprising a first substrate region doped with a first dopant and a second substrate region doped with a second dopant;
   forming a buried oxide (BOX) layer on the substrate;
   forming a channel layer above the BOX layer;
   forming a first transistor on the substrate in the first substrate region;
   forming a second transistor on the substrate in the second substrate region;
   forming first doped source and drain structures being electrically connected to the substrate in the first substrate region and separated by portions of the channel layer and the BOX layer;
   forming second doped source and drain structures being electrically connected to the substrate in the second substrate region and separated by portions of the channel layer and the BOX layer; and
   separating the first transistor and the second transistor by shallow trench isolation.

10. The method according to claim 9, wherein the first dopant comprises a p-type dopant and the second dopant comprises an n-type dopant.

11. The method according to claim 9 further comprising a p-type contact formed in the first substrate region and an n-type contact formed in the second substrate region.

12. The method according to claim 9, wherein:
   forming the first doped source and drain structures comprises recessing the channel layer and the BOX layer in the first substrate region to expose a top surface of the substrate to form first source and drain trench regions and forming the first doped source and drain structures in the first source and drain trench regions; and
   forming the second doped source and drain structures comprises recessing the channel layer and the BOX layer in the second substrate region to expose the top surface of the substrate to form second source and drain trench regions and forming the second doped source and drain structures in the second source and drain trench regions.

13. A method of fabricating a semiconductor wafer, the method comprising:
   providing a silicon-on-insulator (SOI) substrate comprising a first substrate region doped with a first dopant and a second substrate region doped with a second dopant;
   forming a first transistor on the substrate in the first substrate region;
   forming a second transistor on the substrate in the second substrate region;
   forming first doped source and drain structures being electrically connected to the substrate in the first substrate region and separated by portions of a channel layer and a buried oxide (BOX) layer;
   forming second doped source and drain structures being electrically connected to the substrate in the second substrate region and separated by portions of the channel layer and the BOX layer;
   inverting the substrate;
   bonding the substrate to a host substrate;
   removing the substrate thereby exposing the first doped source and drain structures, the second doped source and drain structures and the BOX layer; and
   forming a p-type contact in the first substrate region and an n-type contact in the second substrate region.

14. The method according to claim 13, wherein:
   forming the first doped source and drain structures comprises recessing the channel layer and the BOX layer in the first substrate region to expose a top surface of the SOI substrate to form first source and drain trench regions and forming the first doped source and drain structures in the first source and drain trench regions; and
   forming the second doped source and drain structures comprises recessing the channel layer and the BOX layer in the second substrate region to expose the top surface of the SOI substrate to form second source and drain trench regions and forming the second doped source and drain structures in the second source and drain trench regions.

* * * * *